United States Patent
Eldin et al.

(10) Patent No.: US 7,246,285 B1
(45) Date of Patent: Jul. 17, 2007

(54) METHOD OF AUTOMATIC FAULT ISOLATION IN A PROGRAMMABLE LOGIC DEVICE

(75) Inventors: Tarek Eldin, San Jose, CA (US); Zhi-Min Ling, Cupertino, CA (US); Feng Wang, San Jose, CA (US); David M. Mahoney, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 359 days.

(21) Appl. No.: 10/815,492

(22) Filed: Apr. 1, 2004

(51) Int. Cl.
*G01R 31/28* (2006.01)
*G11C 29/00* (2006.01)

(52) U.S. Cl. .................. 714/725; 714/719; 714/724; 714/742

(58) Field of Classification Search ............. 702/117; 714/725, 742
See application file for complete search history.

(56) References Cited

U.S. PATENT DOCUMENTS 6,470,485 B1 * 10/2002 Cote et al. ................. 716/16
6,694,464 B1 * 2/2004 Quayle et al. ............. 714/725
6,725,442 B1 * 4/2004 Cote et al. ................. 716/16
7,024,327 B1 * 4/2006 Dastidar et al. ........... 702/117

OTHER PUBLICATIONS

U.S. Appl. No. 10/280,611, filed Oct. 25, 2002, Mark et al.
U.S. Appl. No. 10/355,563, filed Jan. 31, 2003, Mark et al.
U.S. Appl. No. 10/619,136, filed Jul. 14, 2003, Mark et al.
U.S. Appl. No. 10/683,919, filed Oct. 10, 2003, Mark et al.
U.S. Appl. No. 10/703,326, filed Nov. 7, 2003, Mark et al.

* cited by examiner

*Primary Examiner*—Albert Decady
*Assistant Examiner*—Saqib Siddiqui
(74) *Attorney, Agent, or Firm*—Scott Hewett

(57) ABSTRACT

The configuration of a faulty line segment in a switch matrix of a programmable logic device is identified using read-back capture. Each original programmable interconnection point ("PIP") in the line segment is tested by generating routes from a first logic port through the original line segment and PIP, through all PIPs, adjacent to the original PIP to the opposite logic port. Routes through all PIPs adjacent to the PIPs in the line segment from the first logic port to the second logic port, and from the second logic port to the first logic port, are tested to isolate the fault in the line segment.

23 Claims, 12 Drawing Sheets

METHOD OF AUTOMATIC FAULT ISOLATION IN A PROGRAMMABLE LOGIC DEVICE

FIELD OF THE INVENTION

This invention relates generally to locating electrical faults, such as opens and shorts, in integrated circuits, and more specifically to locating faults in a line segment in a switching array of a programmable logic device.

BACKGROUND OF THE INVENTION

Programmable logic devices ("PLDs"), such as complex programmable logic devices ("CPLDs") and field-programmable gate arrays ("FPGAs") have a fabric of logic devices (e.g. flip-flops in configurable logic blocks) interconnected with a switch matrix of conductive signal lines (also known as interconnect lines) and programmable interconnect points ("PIPs"). The switch matrix typically provides many different selectable paths (commonly called line segments or routes) between an input (e.g. a first flip-flop) and an output (e.g. a second flip-flop). When the user configures the PLD to perform a selected logic function (i.e. programs the PLD), the line segments are defined (routed) through the switch matrix.

A PIP is basically a programmable pass transistor that is enabled (switched on) to electrically connect signal lines of the routing network. Each PIP typically has several inputs and several outputs. Some PIPs have as many as 20 combined ways of going into and out of the PIP. This means that each PIP can be used in any of several different routes through the switch matrix.

In a line segment between two flip-flops a first flip-flop is connected to a first PIP with a signal line (also known as a metal trace or "wire"), and the first PIP is connected to second PIP with another signal line and so forth until the final PIP in the line segment is connected to a second flip-flop. There are typically many possible routes between the first and second flip-flops, but one is configured by the user, or is automatically configured for the user, when the PLD is programmed. For purposes of discussion, the originally programmed line segment will be called the "original signal path."

Occasionally, a PLD fails after it has been tested electrically. It is highly desirable to analyze a failed PLD to determine why the part failed. In some cases, the failure is due to a faulty line segment. A faulty line segment is identified using read-back capture techniques. After the faulty line segment is identified, the location of the faulty line segment on the silicon chip is determined from the manufacturing documentation, and the chip is physically deprocessed to microscopically examine each layer of the faulty line segment in the physical device to see if a fault can be identified. The fault might be a break in a wire trace, a shorted trace, or a high-resistive via, for example.

However, even if the failed line segment is identified, the fault is frequently not observed or observable. Furthermore, deprocessing the failed part, layer by layer, and visually inspecting the line segment after each step of removal is very time consuming and expensive.

Therefore, a fault isolation technique that more reliably identifies points of failure in a line segment is desirable.

SUMMARY OF THE INVENTION

Faults in a line segment of a PLD are isolated using an automated test technique. A PLD includes a field programmable gate array (FPGA) or complex programmable logic device (CPLD) or any other IC having one or more programmable interconnections. And a PIP includes a PIP of an FPGA or a CPLD or a programmable interconnection in any other IC having one or more programmable interconnections. In one embodiment, a PIP in the original line segment is coupled to a port (e.g. an input flip-flop or an output flip-flop) of a switch matrix through a portion of the original line segment, and to the other port through an adjacent PIP. The route from the adjacent PIP to the other port is selected by an auto-route tool in some embodiments.

A generic test vector is provided at the input of the line segment and measured at the output of the line segment. The test results and route are stored. The PIP is connected to the other port through another adjacent PIP, and the test pattern is again provided and measured. This process is repeated for each adjacent PIP, and then repeated for each PIP in the line segment. In one embodiment, the test is done in a first direction (e.g. from input to output), and then in a second direction (output to input) to comprehensively test the all PIPs adjacent to the PIPs in the original signal line. Evaluating the test data for the adjacent PIPs facilitates fault isolation by providing indications where in the failed device the fault occurred and in some cases the nature of the fault.

DETAILED DESCRIPTION OF THE DRAWINGS

Figure 1A:
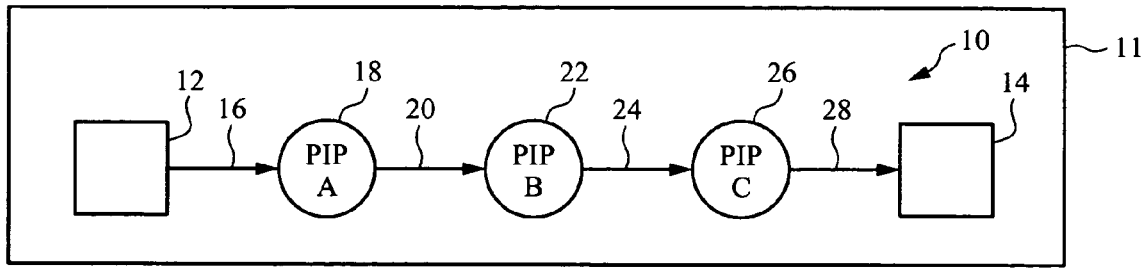
FIG. 1A shows a line segment suitable for use with embodiments of the present invention.

FIG. 1A shows a line segment 10 suitable for use with embodiments of the present invention. The line segment 10 connects an input 12 with an output 14 and is typically part of a switch matrix in a PLD 11. The input 12 and output 14 are flip-flops, look-up tables ("LUTs") or other logic devices or ports, for example. The terms "input" and "output" are used merely for convenience of discussion. Electric signals can travel in either direction along the line segment 10.

A failing line segment is identified using read-back capture techniques, such as are described in co-owned, co-pending U.S. patent application Ser. No. 10/280,611, entitled "Method and Apparatus for Localizing Faults within a Programmable Logic Device", by David Mark et al., filed on Oct. 25, 2002, the disclosure of which is hereby incorporated in its entirety for all purposes. Once the failing line segment is identified, it is desirable to identify the where the fault occurred, and why the fault occurred, i.e. the manufacturing or design defect that caused the failure.

Several types of faults can occur, such as opens, shorts, and high resistance vias between the input 12 and output 14. Currently, manual deprocessing and inspection are used to isolate a fault. However, fault isolation is very time consuming, even for short line segments (e.g. having 3–4 PIPs), and there is a high probability (up to 50% in some cases) of not ever identifying the fault. Manual fault isolation becomes extremely impractical, essentially impossible, for longer line segments, which often occur in current FPGAs. For example, in the VIRTEX II™ and VIRTEX II-P™ FPGAs, available from XILINX, INC., of San Jose, Calif., line segments can have more than 4 PIPs. Conventional deprocessing and inspection techniques are not suitable for fault isolation on long line segments (i.e. having more than 4 PIPs).

For simplicity of illustration and discussion, the line segment 10 has 3 PIPs 18, 22, 26 and four signal lines 16, 20, 24, and 28. The line segment 10 is shown in its original configuration, that is, with PIPs 18, 22, 26, and signal lines 16, 20, 24, 28 connecting the input 12 to the output 14, as when the PLD failure occurred.

The original path (line segment) between the input 12 and the output 14 is typically obtained by read-back capture, which indicates the PIPs and signal lines in use when the line segment failed. The first signal line 16 and last signal line 28 in the line segment are usually the only way to connect the input 12 to the first PIP 18 and the last PIP 26 to the output 14, respectively, are commonly know as local pin wires. However, there are many ways to connect PIP A to PIP C.

Figure 1B:
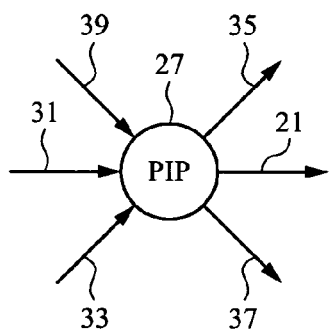
FIG. 1B shows a portion of the line segment of FIG. 1A illustrating additional input and output signal lines to a PIP.

FIG. 1B shows additional input and output signal lines to a PIP 27. Only three input signal lines 29, 31, 33 and three output signal lines 21, 35, 37 are shown for simplicity of illustration, but PIPs can have many more input and output signal lines, especially in PLDs that have several layers of metallization interconnected with vias. The arrowheads on the input and output lines are merely for purposes of illustration and convenience of discussion.

A test script according to an embodiment of the present invention generally tests all paths into the PIP 27 and all paths out of the PIP 27. Referring to FIG. 1A, only the local pin wire 16 is tested for the first PIP 18, and only the local pin wire 28 is tested for the last PIP 26 in some embodiments. A PIPs database defines the inputs and outputs for each PIP.

The PIPs database associates PIPs by row and column information (i.e. provides a textual listing of the PIPs). PIPs that are adjacent to the PIP being evaluated (e.g. PIP A) are identified by a common signal line (i.e. a signal line that connects one PIP to the other). For example, if signal line 20 is listed in the PIP data base as "SN20," the PIP on the other end of SN20 (i.e. PIP B, ref. num. 22 in FIG. 1A) is adjacent to PIP A 18 because the PIP B is separated from PIP A by a single signal line. Similarly, signal line 34 is common to PIP A 18 and PIP D 38 (see FIG. 1C, ref. num. 38), hence PIP D is also adjacent to PIP A. In this manner, all of the PIPs that are adjacent to PIP A (i.e. all PIPs separated by single signal line) are identified using the PIPs database for the PLD.

A typical test script works by producing a generic vector file that runs lows (digital "0s") and highs (digital "1s") through the voltage input 12 of the line segment. The term "generic" indicates that a common vector file is used for evaluating different paths, and even different line segments. A unique vector file (e.g. for each path or line segment) is not required for each path, and the vector file is very simple and does not require extensive experience in digital test pattern generation.

In one embodiment, a vector file generates a series of a first digital test value (e.g. lows), followed by a series of a second digital test value (e.g. highs), which will be called a "test vector" for convenience of discussion. It is desirable to send multiple lows/highs through the line segments to detect time-dependent failures (e.g. a failure that is not read at the output 14 on the first digital test value, but that would be captured on the second or third digital test value in the series). In a particular embodiment, a test pattern includes a series of three lows followed by a series of three highs, followed by another series of lows (typically three). Such a sequence is particularly desirable for detecting a "stuck high" type of failure in the line segment, given that the flip-flops are initialized to zeros.

For example, if the input and output flip-flops are set to zero before applying the test vector, a zero would be expected to be read on the first two clock cycles, which verifies proper flip flop operation, so a third bit in the sequence is desirable. Having a low-high-low test vector toggles the flip flops from both zero-to-one and one-to-zero conditions, providing more test information than if only one condition was toggled.

In an alternate embodiment, both the input and output flip flops are initially set high. A series of highs is followed by a series of lows that is followed by a series of highs. Such a sequence is particularly desirable for detecting a "stuck low" type of failure in the line segment.

Figure 1C:
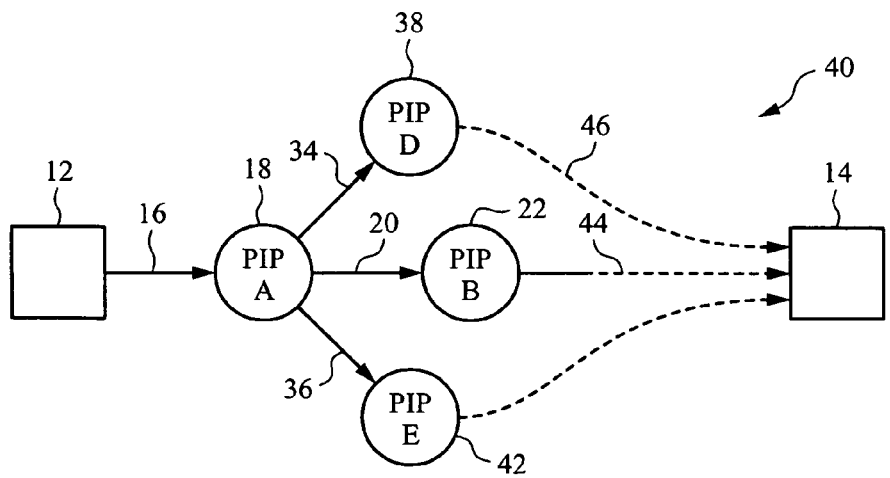
FIG. 1C shows a portion of a switching matrix illustrating PIPs adjacent to the first PIP in the original line segment.

FIG. 1C shows a portion of a switching matrix 40 illustrating testing the first PIP 18 in the original line segment. Three signal lines 20, 34, 36 connect the first PIP 18 in the original line segment (see FIG. 1A, ref. num. 10) to three adjacent PIPs 22, 38, 42.

There are many embodiments of the invention. In one embodiment, a test script generates a route through a PIP in the original line segment and an adjacent PIP and applies and reads a test vector, thus testing all possible routes of interest. In an alternative embodiment, all routes through all PIPs in the original line segment and all adjacent PIPs are generated and stored in a route directory. A test vector is applied and read for each route in the route directory, thus testing all possible routes of interest.

For example, a path is generated from the input 12 to the first PIP 18, and from the first PIP 18 to PIP 22 using data in the PIPs database. The remainder of the route to the output 14 is any suitable path (represented by dashed line 44), and is typically generated by an auto-route tool.

In one embodiment, the route through PIP A 18, PIP B 22, and the remainder 44 is stored in a route directory. All routes of interest are generated, and then the test vector is applied through each route in a sequential fashion. In an alternate embodiment, the route is tested after being generated, and then the next route is generated. Test data, which can be qualitative pass/fail data and/or quantitative data, is captured for each route, and the test data and route are stored. In some embodiments, it is not necessary to store the entire route with the test result because the portions of the routes that are of interest in some cases are from the data port (input/output) through the original PIPs and their adjacent PIPs. In some embodiments, the auto-route path includes local pin wire 28.

The test script then generates another route through PIP A 18 and PIP D 38. The auto-route tool finishes the routing (represented by dashed line 46) from PIP D 38 to the output 14. The process is repeated for the third PIP E 42 that is adjacent to PIP A 18. Thus, all routes through the first PIP A 18 and all of its adjacent PIPs 22, 38, 42 are generated.

The process is repeated for the other PIPs in the original line segment, and then in the direction from the output to the input. The routes are stored in a route directory used by the test script. After all the routes of interest have been generated, the test vector is applied at the input and read at the output for each route in the route directory. Pass/fail data (i.e. whether the pattern measured at the output 14 was consistent with the input test pattern) for each route is stored. In an alternative embodiment the test vector is different for different routes through the switch matrix 40.

It is desirable to test all routes through PIPs and their adjacent PIPs because the physical mechanism causing the fault does not necessarily affect only PIPs along the line segment. Similarly, PIPs are tested in both "directions" because a PIP typically has different adjacent PIPs on each side. A PIP operates essentially as a switch. The signal lines and PIPs coupled to one side (e.g. "input") of the switch are different than the signal lines and PIPs coupled to the other side (e.g. "output") of the switch. Thus, the line segment is tested in the "forward" direction (from input to output) and in the "reverse" direction (from output to input) to obtain a comprehensive characterization of the failed line segment. Further illustration of this is provided in FIG. 2.

Figure 1D:
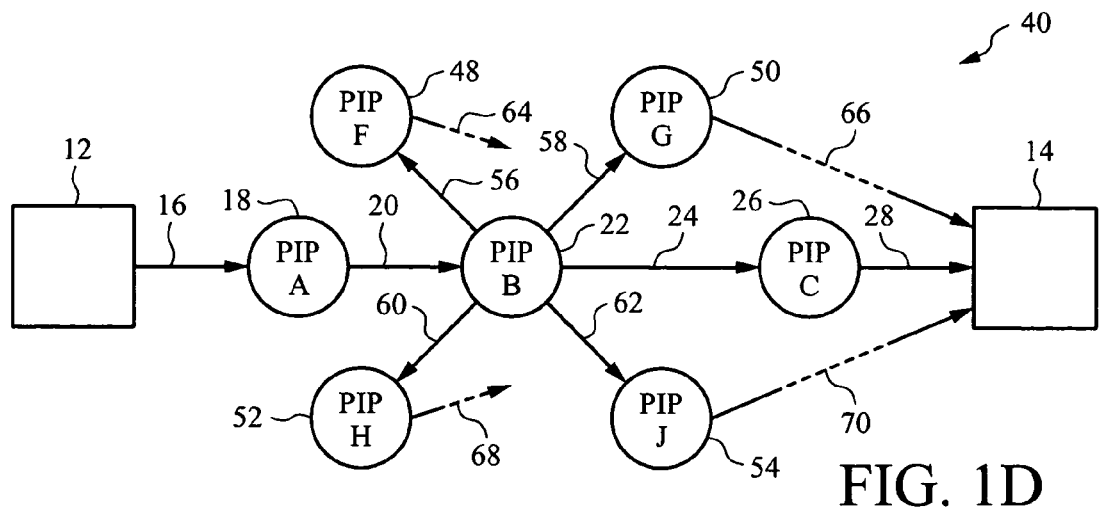
FIG. 1D shows a portion of a switching matrix illustrating progressive testing of a line segment.

FIG. 1D shows a portion of the switching matrix 40 of FIG. 1C for testing an intermediate PIP. PIP B 22, which is the next PIP in the original line segment, is tested by testing routes through all PIPs 26, 48, 50, 52, 54 that are adjacent to PIP B 22. The five adjacent PIPs 26, 48, 50, 52, 54 are connected to PIP B 22 by signal lines 24, 56, 58, 60, 62, respectively.

The original signal path (local pin wire 16 and signal line 20) is used from the input 12 to PIP B 22. All possible routes from PIP B 22 through adjacent PIPs 26, 48, 50, 52, 54 are tested as described above in reference to FIG. 1C. The auto-route tool is usually used to finish off the routing from the adjacent PIPs 48, 50, 52, 54 to the output 14. These auto-routed portions of the routes are shown as dashed lines 64, 66, 68, and 70. Testing all possible routes from PIP B 22 to the output 14 provides data that facilitates locating the physical location of the fault on the device.

PIP C 26 is connected to PIP B 22 by signal line 24, which is part of the original line segment. Similarly, PIP C 26 is connected to the output 14 by local pin wire 28, which is also part of the original line segment. This route from PIP B 22 to the output 14 is shown as a solid line because it is not randomly generated by the auto-route tool, as the local pin wire 28 directly connects the output 14 to PIP C 26.

Figure 1E:
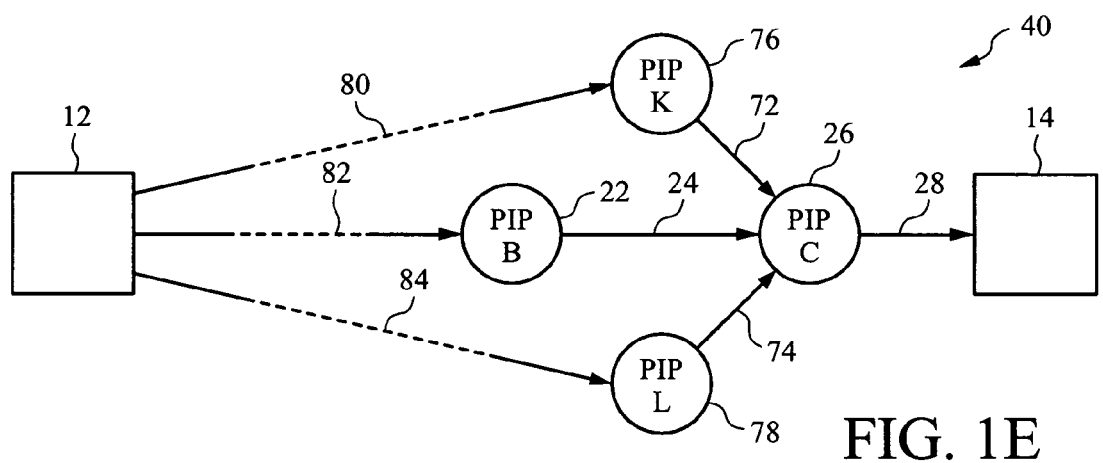
FIG. 1E shows a portion of the switching matrix of FIG. 1C for testing the last PIP in the original line segment.

FIG. 1E shows a portion of the switching matrix 40 of FIG. 1C for testing the last PIP 26 in the original line segment. The test script determines which lines 24, 72, 74 connect directly from PIP C 26 to adjacent PIPs 22, 76, 78. The paths 80, 82, 84 from the input 12 to the adjacent PIPs 22, 76, 78 are generated by the auto-route tool. Local pin wire 28 connects PIP C 26 to the output 14. After generating all routes through all the PIPs 22, 76, 78 adjacent to PIP C 26, the routes are stored in the route directory or are alternatively tested. Testing these routes is referred to as testing in the "reverse" direction for purposes of convenient discussion, even though the test vector is applied at the input 12 and read at the output 14.

Figure 1F:
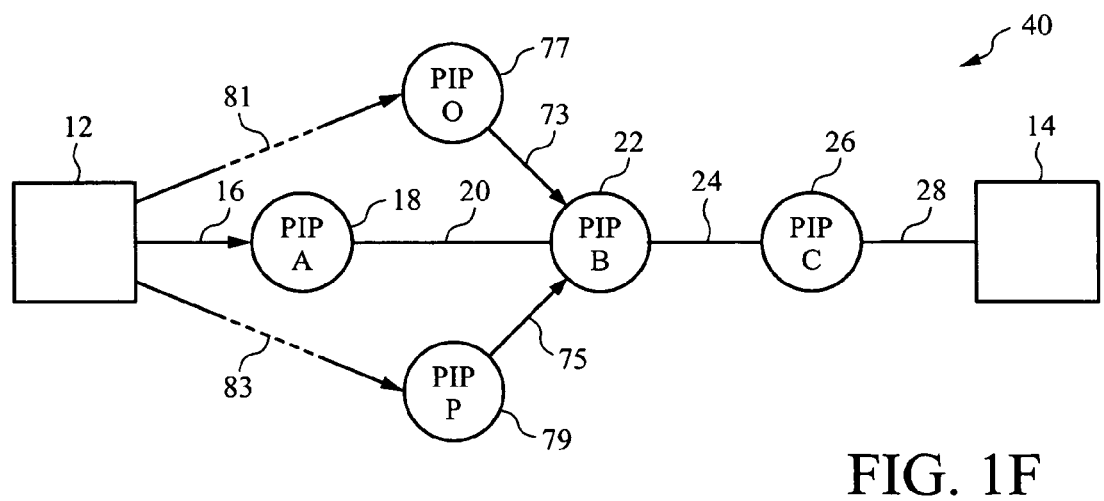
FIG. 1F shows a portion of the switching matrix of FIG. 1C for testing an intermediate PIP in the original line segment in the reverse direction.

FIG. 1F shows a portion of the switching matrix 40 of FIG. 1C for testing the intermediate PIP B 22 in the original line segment in the reverse direction (compare FIG. 1D). A path from the output 14 to PIP B 22 is generated using local pin wire 28 and original signal line 24. Three PIPs 18, 79, 77 are adjacent to PIP B 22, and are connected to PIP B 22 by signal lines 20, 73, 75, respectively.

All possible routes from PIP B 22 to adjacent PIPs 18, 77, 79 are generated as described above in reference to FIGS. 1C and 1D. The auto-route tool is typically used to finish off the routing from the adjacent PIPs 77, 79 to the input 12. These auto-routed portions of the routes are shown as dashed lines 81, 83.

PIP A 18 is connected to PIP B 22 by signal line 20, which is part of the original line segment. Similarly, PIP A 18 is connected to the input 12 by local pin wire 16, which is also part of the original line segment. This route from PIP B 22 to the input 12 is shown as a solid line because it is not randomly generated by the auto-route tool, as the local pin wire 28 directly connects the output 14 to PIP C 26.

Alternative embodiments of the invention have different testing sequences. For example, testing begins with PIP C 26 instead of PIP A 18, or begins with an intermediate PIP, such as PIP B 22. In a further embodiment, the auto-route tool excludes PIPs and signal lines used in the original line segment to reduce the possibility of including the original fault in the auto-route paths.

If the original line segment includes additional intermediate PIPs (not shown), they are tested in a fashion similar to the method described in relation to FIGS. 1C–1F. Faults are isolated in long line segments, such as line segments having more than 4 PIPs, using these techniques. When electrical testing is complete, the pass/fail data is evaluated against the layout schematic for the failed device.

Figure 2:
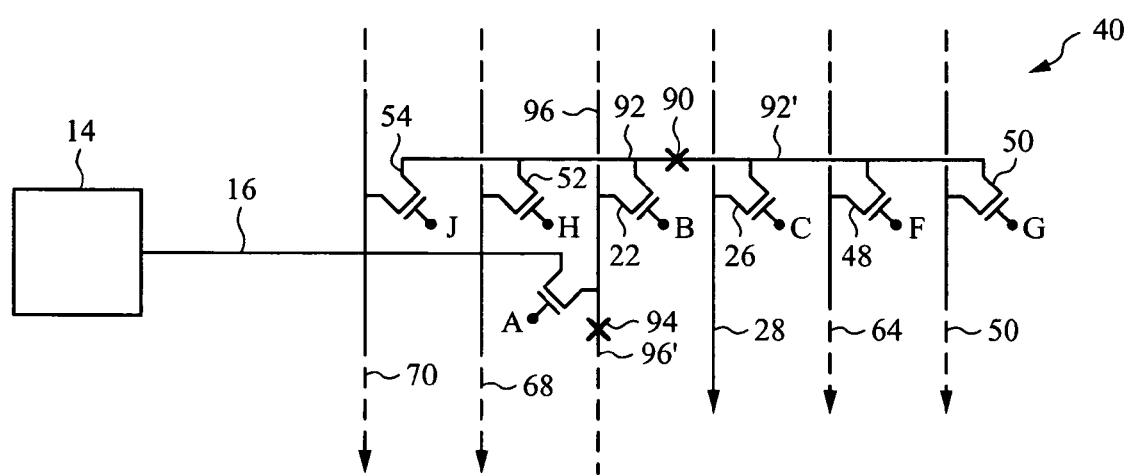
FIG. 2 is a simplified diagram of a portion of the switch matrix illustrating fault isolation.

FIG. 2 is a simplified diagram of a portion of the switch matrix 40 illustrating fault isolation. Referring to both FIGS. 1D and 2, if routes from PIP B 22 through PIP C 26, PIP G 50 and PIP F 48 all fail, but routes from PIP B 22 through PIP H 52 and PIP J 54 all pass, an open 90 on the metal trace 92, 92' could cause this type of fail pattern, whereas a short from the metal trace 92, 92' to ground or another metal layer might cause a different fail pattern. The location of a fault is determined by comparing the electrical test data with the layout schematic and optionally with the electrical schematic of the device. In many cases, the region that needs to be analyzed is reduced from an entire line segment to a particular section of a wire trace, particular vias, or particular PIPS.

Similarly, a fault 94 could occur on the "input" side of PIP B, on metal trace 96, 96', for example. PIPs (not shown) adjacent to PIP B 22 on metal trace 96, 96' are tested to further characterize the switching matrix adjacent to the original line segment. Thus, techniques according to embodiments of the invention enable isolating faults on even long line segments in a convenient and reliable manner.

Thus, embodiments of the invention enable isolating faults on a failed line segment, and the ability to correlate the electrical fault with a particular location on the silicon device. Such techniques are highly desirable during the design of a PLD, as well as for debugging a failed port, in order to improve the design and/or manufacturing process to avoid such faults. The test vectors used are very simple, and do not require extensive test pattern generation experience. Automatic, comprehensive testing of all adjacent PIPs along the original line segment enables fault isolation to a physically small portion of the line segment. Automatic testing is very efficient compared to conventional manual techniques that use unique, complex test patterns to evaluate line segment failures.

Figure 3A:
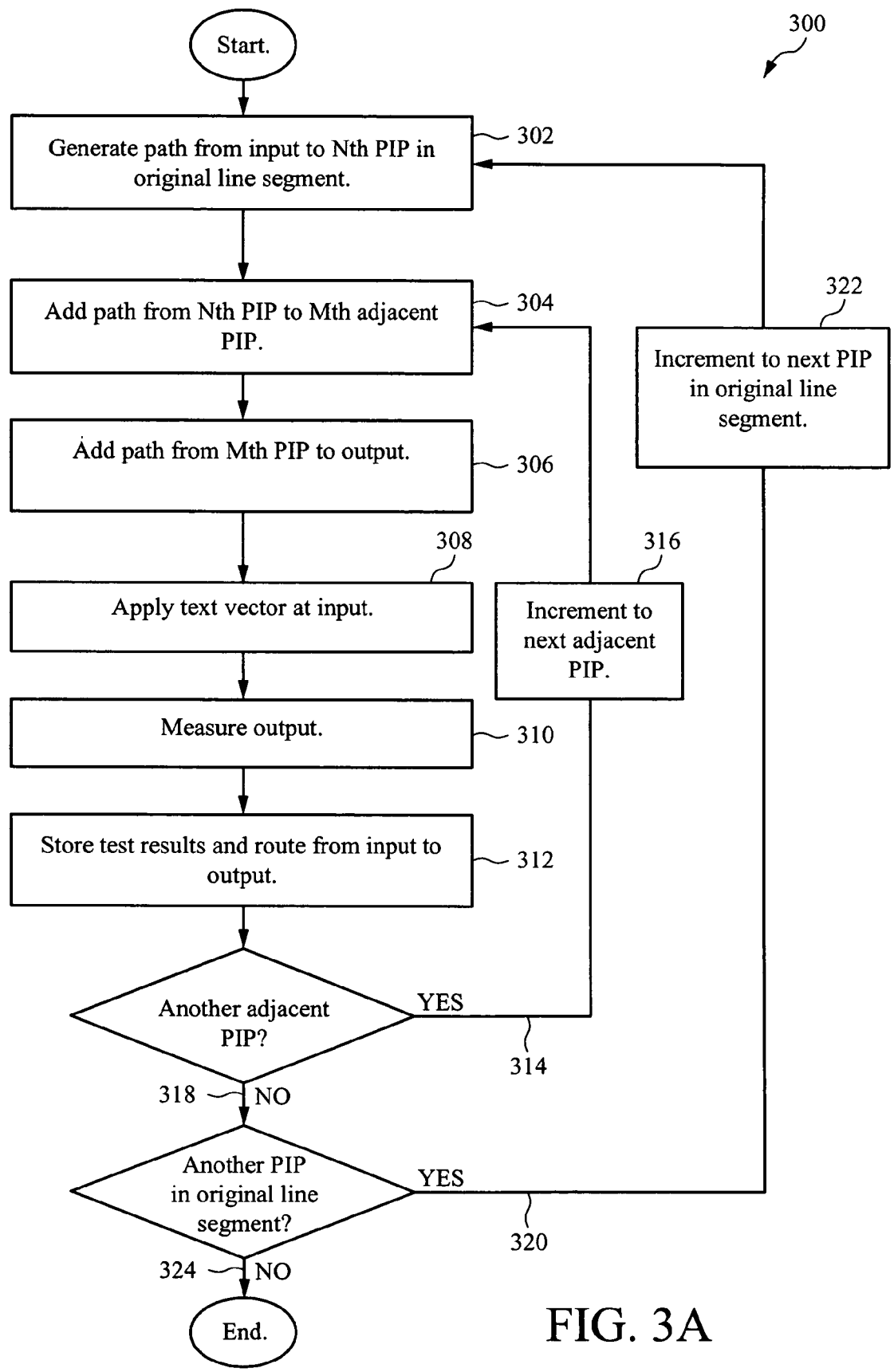
FIG. 3A is a flow chart of a method of testing a line segment of a PLD according to an embodiment of the present invention.

FIG. 3A is a flow chart of a method 300 of testing a line segment of a PLD according to an embodiment of the present invention. This method tests PIPs adjacent to the original line segment in the "forward" direction. A path is generated from the input to the first (generally Nth, where N is an integer) PIP in the original line segment (step 302). A path is then added from the Nth PIP in the original line segment to a first (generally Mth, where M is an integer) adjacent PIP in the switch matrix (step 304), which can be identified using a PIP database (dB). The term "first" is used solely for purposes of convenient discussion and indicates only that the indicated PIP is first in the test sequence. Any of the adjacent PIPs could be the first in the test sequence. Similarly, the line segment could be tested front-to-back, back-to-front, or in any of several sequences (e.g. starting with an intermediate PIP).

A path is added from the Mth adjacent PIP to the output (step 306). An auto-route tool is optionally used to add this path. The route between the input and the output is configured in the switch matrix, a test vector is applied at the input (step 308) and test results are measured at the output (step 310). The test results and route or a portion of the route from the input to the output are stored (step 312). If there is another adjacent PIP (branch 314), the test script increments to the next adjacent PIP (step 316), and the test is repeated until all adjacent PIPs in the forward direction have been tested (branch 318).

If there is another PIP in the original line segment (branch 320), the test script increments to the next PIP in the original line segment (step 322), and the test is repeated until all PIPs in the original line segment have been tested through all their adjacent PIPs (branch 324).

Figure 3B:
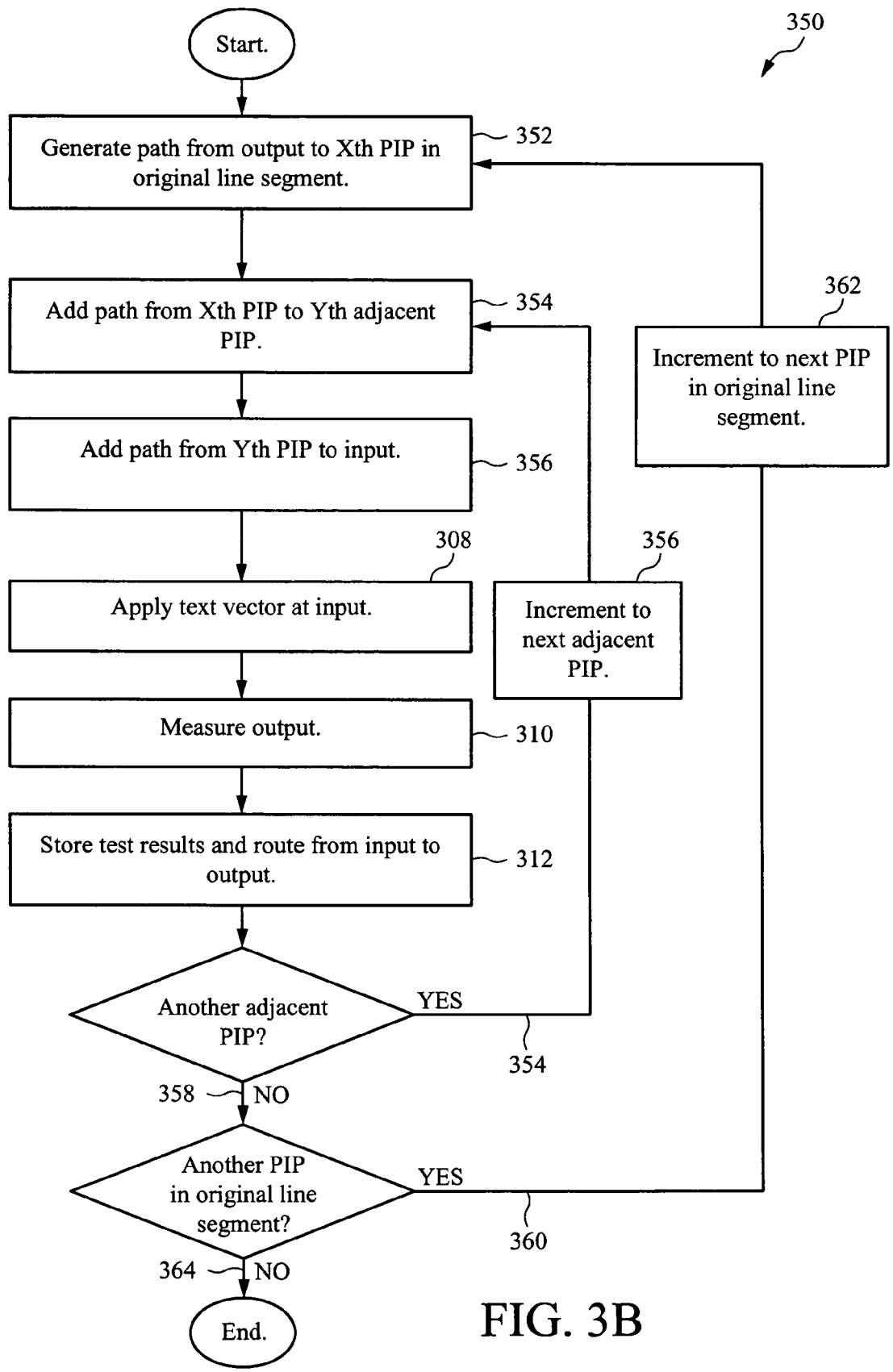
FIG. 3B is a flow chart of a method of testing a line segment of a PLD according to another embodiment of the present invention.

FIG. 3B is a flow chart of a method 350 of testing a line segment of a PLD according to an embodiment of the present invention. This method tests PIPs adjacent to the original line segment in the "reverse" direction. A path is generated from the output to the first (generally Th, where X is an integer) PIP in the original line segment (step 352). A path is then added from the Xth PIP in the original line segment to a first (generally Yth, where Y is an integer) adjacent PIP in the switch matrix (step 354), which can be identified using a PIP database (DB)—. The term "first" is used solely for purposes of convenient discussion and indicates only that the indicated PIP is first in the test sequence. Any of the adjacent PIPs could be the first in the test sequence. Similarly, the line segment could be tested front-to-back, back-to-front, or in any of several sequences (e.g. starting with an intermediate PIP).

A path is added from the Yth adjacent PIP to the input (step 356). An auto-route tool is optionally used to add this path. The route between the input and the output is configured in the switch matrix, a test vector is applied at the input (step 308) and test results are measured at the output (step 310). The test results and route or a portion of the route from the output to the input are stored (step 312). If there is another adjacent PIP (branch 354), the test script increments to the next adjacent PIP (step 356), and the test is repeated until all adjacent PIPs have been tested (branch 358).

If there is another PIP in the original line segment (branch 360), the test script increments to the next PIP in the original line segment (step 362), and the test is repeated until all PIPs in the original line segment have been tested through all their adjacent PIPs in the reverse direction (branch 364).

Figure 4A:
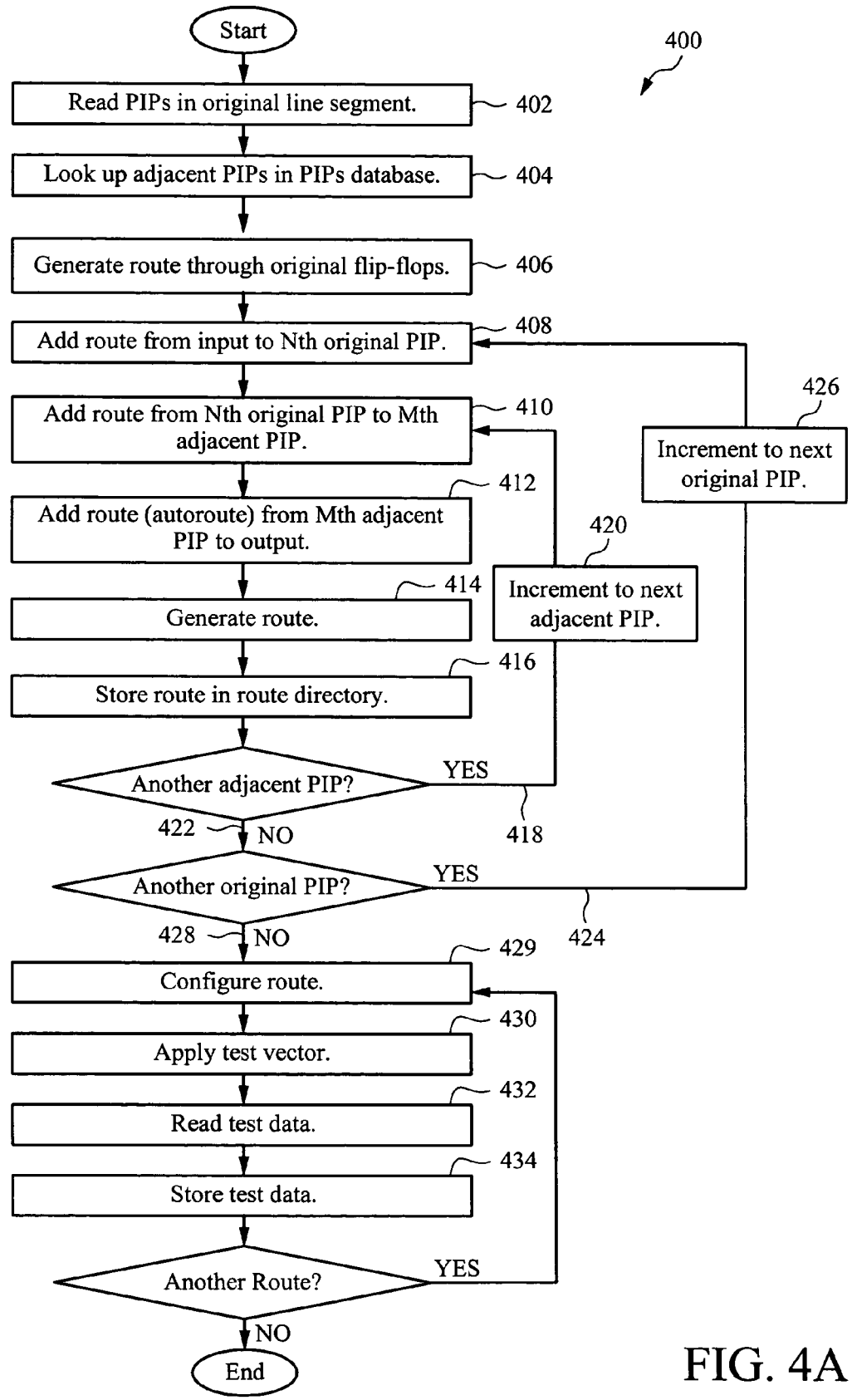
FIG. 4A is a flow chart of a method of testing a line segment of a PLD according to another embodiment of the present invention.

FIG. 4A is a flow chart of a method 400 of testing a line segment of a PLD according to another embodiment of the present invention. A test script reads the PIPs ("original PIPs") used in an original line segment (step 402). The PIPs are identified in a failed line segment by using read back capture, for example. All PIPs adjacent ("adjacent PIPs") to the original PIPs in the forward direction are identified in a PIPs database (step 404). A first portion of a route is generated using the original logic ports (e.g. input and output ports/flip-flops) (step 406). A second portion of the route is added to connect the input to the Nth PIP in the original line segment (step 408). A third portion of the route is added to connect the Mth adjacent PIP, as described in the PIPs database, to the Nth PIP (step 410). A fourth portion of the route is added to connect the Mth PIP to the output (step 412), typically using an auto-route tool or a restricted auto-route. The route is generated (step 414) and stored in a route directory (step 416). If there is another adjacent PIP (branch 418), the test script increments to the next adjacent PIP (step 420), and routes are generated until routes through all adjacent PIPs in the forward direction have been generated (branch 422).

If there is another original PIP (branch 424), the test script increments to the next original PIP (step 426), and routes are generated until all routes through all original PIPs and all their adjacent PIPs in the forward direction have been generated (branch 428).

For each route in the route directory, the switching matrix is configured (step 429), a test vector is applied to the input (step 430), and test data is read at the output (step 432) and stored (step 434). In other words, a route in the route directory is configured in the switch matrix and the test vector is applied, then another route in the route directory is configured in the switch matrix and the test vector is applied again, and so forth. Each route in the route directory has associated stored test data.

Figure 4B:
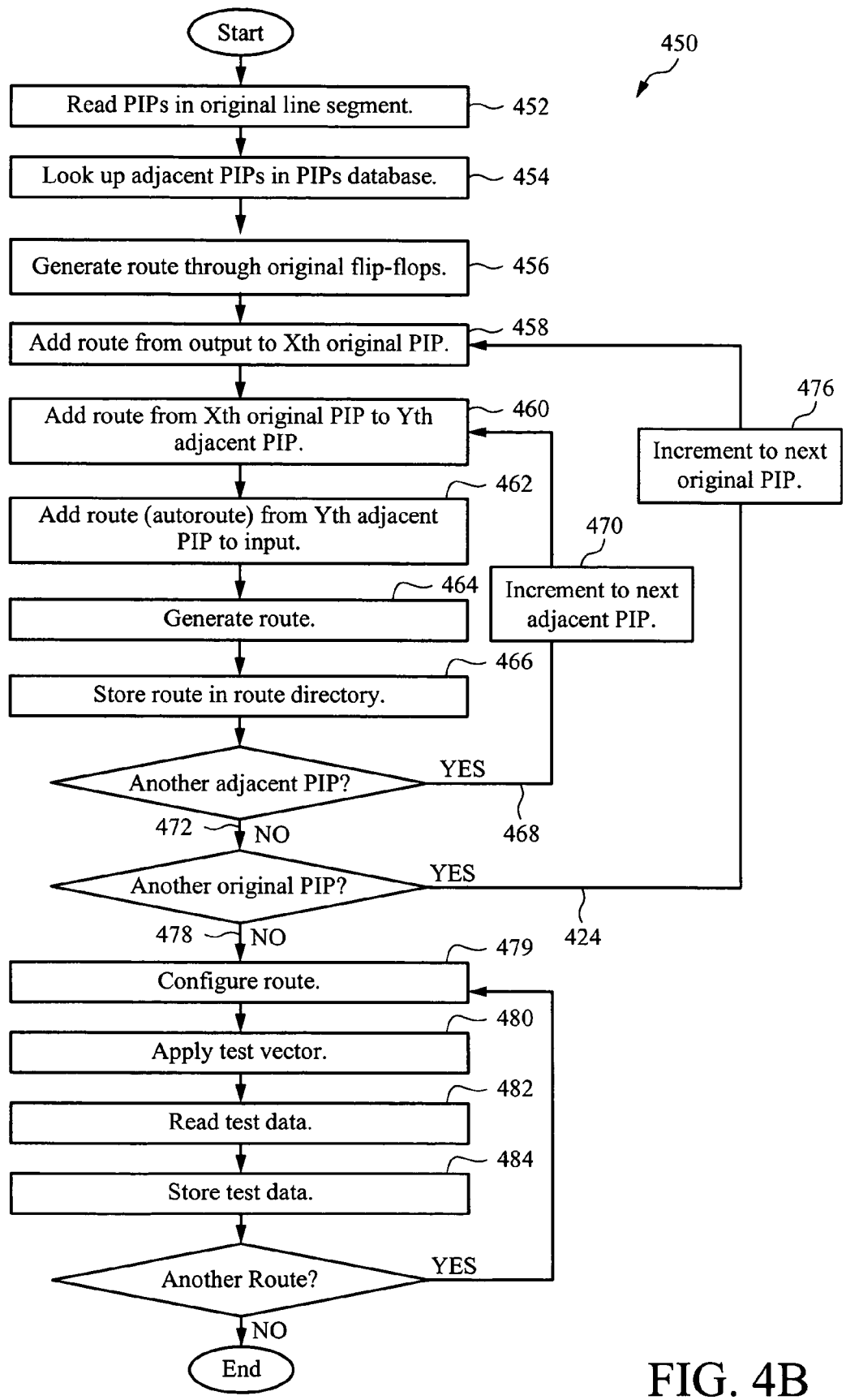
FIG. 4B is a flow chart of a method of testing a line segment of a PLD according to another embodiment of the present invention.

FIG. 4B is a flow chart of a method 450 of testing a line segment of a PLD according to another embodiment of the present invention. A test script reads the PIPs ("original PIPs") used in an original line segment (step 452). The PIPs are identified in a failed line segment by using read back capture, for example. All PIPs adjacent ("adjacent PIPs") to the original PIPs in the reverse direction are identified in a PIPs database (step 454). A first portion of a route is generated using the original logic ports (e.g. input and output ports/flip-flops) (step 456). A second portion of the route is added to connect the output to the Xth PIP in the original line segment (step 458). A third portion of the route is added to connect the Yth adjacent PIP, as described in the PIPs database, to the Xth PIP (step 460). A fourth portion of the route is added to connect the Yth PIP to the input (step 462), typically using an auto-route tool or a restricted auto-route. The route is generated (step 464) and stored in a route directory (step 466). If there is another adjacent PIP (branch 468), the test script increments to the next adjacent PIP (step 470), and routes are generated until routes through all adjacent PIPs in the reverse direction have been generated (branch 472).

If there is another original PIP (branch 474), the test script increments to the next original PIP (step 476), and routes are generated until all routes through all original PIPs and all their adjacent PIPs in the forward direction have been generated (branch 478).

For each route in the route directory, the switching matrix is configured (step 479), a test vector is applied to the input (step 480), and test data is read at the output (step 482) and stored (step 484). In other words, a route in the route directory is configured in the switch matrix and the test vector is applied, then another route in the route directory is configured in the switch matrix and the test vector is applied again, and so forth. Each route in the route directory has associated stored test data.

Figure 5:
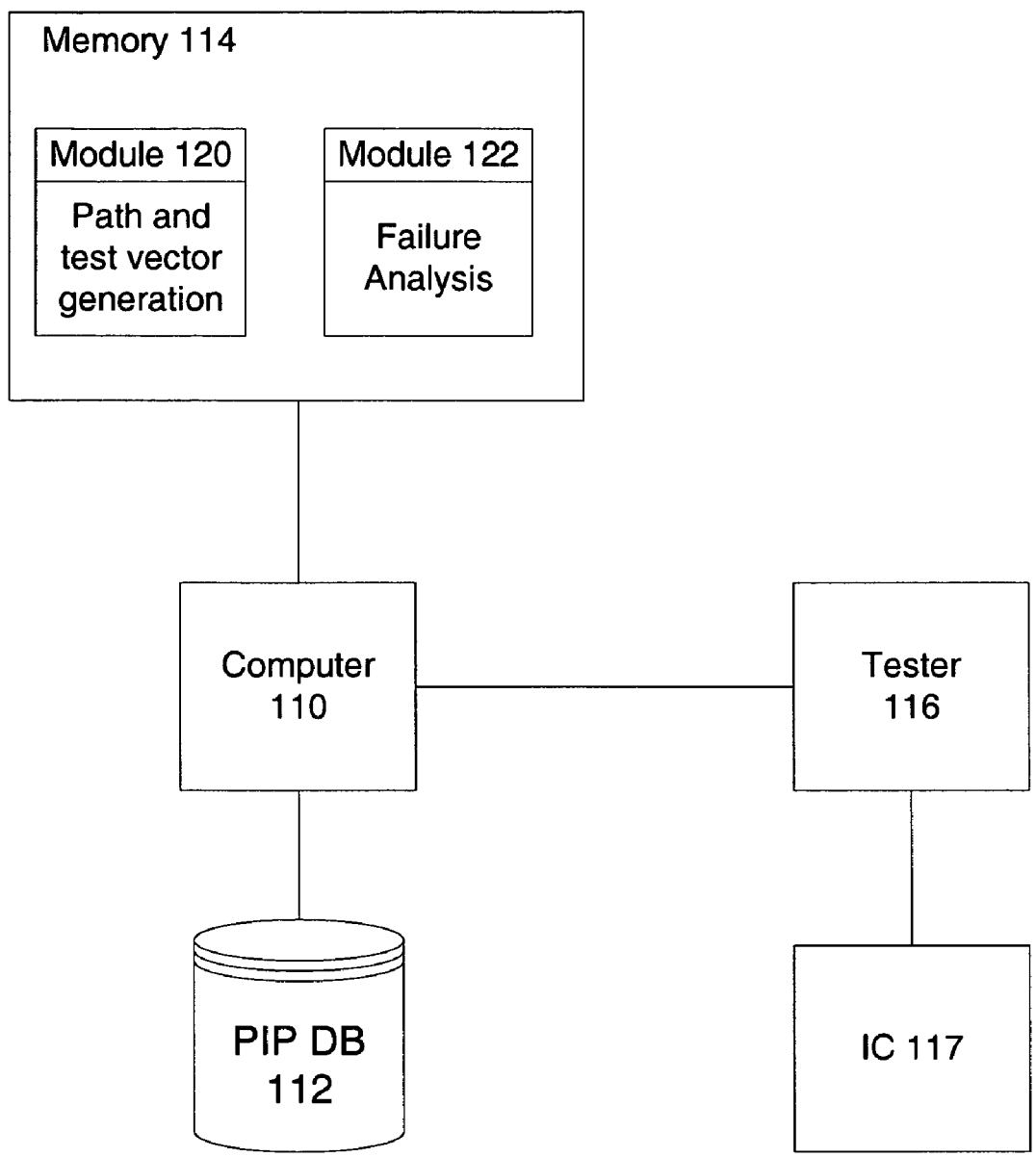
FIG. 5 is a simplified block diagram of a fault isolation system of an embodiment of the present invention.

FIG. 5 is a simplified block diagram of a fault isolation system of an embodiment of the present invention. The fault isolation system includes a computer 110 having a microprocessor and coupled to a memory 114 and a PIP database (DB) 112. The fault isolation system further includes a tester 116 coupled to the computer 110 and configured to test an integrated circuit 117 having programmable logic, for example, a programmable logic device (PLD) 11. The memory 114 includes two software modules: module 120 that performs the path and test vector generation and module 122 that performs the failure analysis on the test results in order to isolate or partially isolate the fault(s). While the computer 110, PIP DB 112, memory 114, and tester 116 are shown as separate units, in other embodiments they can be sub-parts of one unit or can, in various combinations, be combined or separated into one or more hardware or software units.

Figure 6:
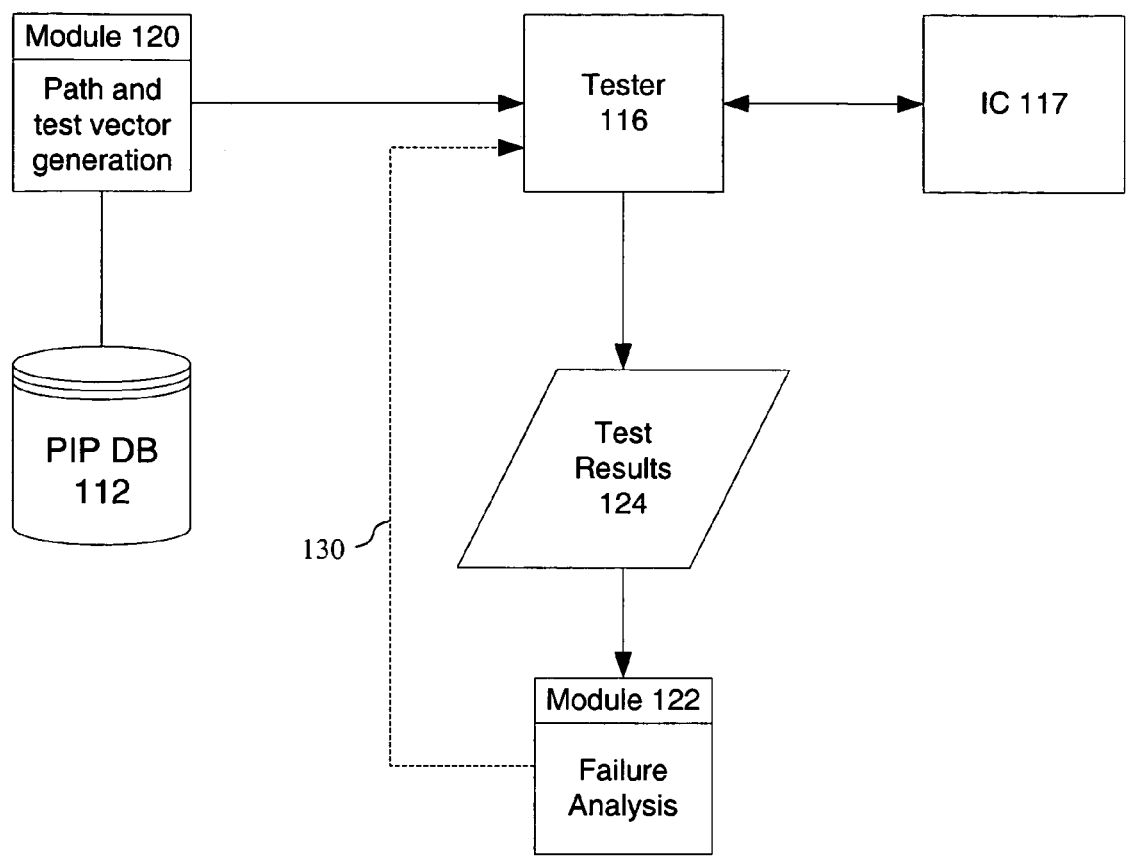
FIG. 6 is a block diagram illustrating one fault isolation method of an embodiment of the present invention.

FIG. 6 is a block diagram illustrating one fault isolation method of an embodiment of the present invention. FIG. 6 may be better understood in light of FIGS. 5 and 4A (and also 4B). Let, for purposes of illustration, IC 117 be a PLD such as a field programmable gate array (FPGA) or complex programmable logic device (CPLD) or any other IC having any programmable interconnections. PIP DB 112 includes a comprehensive listing of all or nearly all or a substantial number of the programmable interconnections (i.e., PIPs) of the PLD. Steps/branches 402–428 of FIG. 4A (and steps/branches 452–478 of FIG. 4B) are part of module 120. Steps 429 to 434 (and steps 479–484 of FIG. 4B) are part of the tester program (not shown) running on tester 116 that tests IC 117 and produces the test results 124.

Figure 7A:
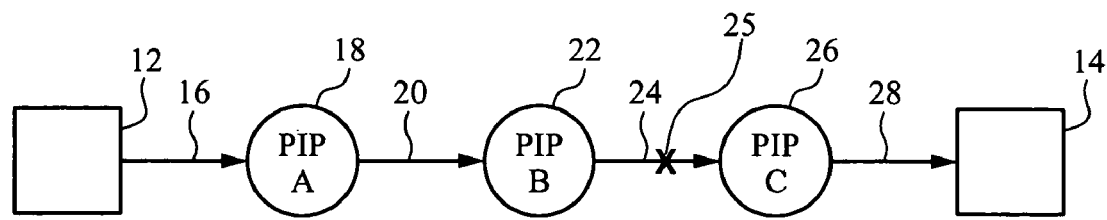
FIGS. 7A to 7E are a simplified example illustrating the processes shown in FIGS. 4A and 6.
Figure 7B:
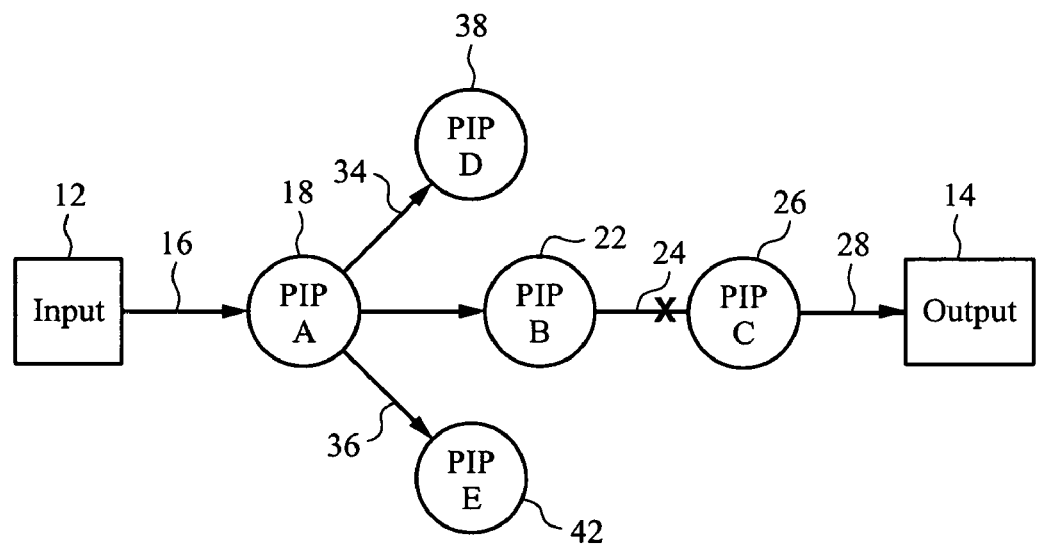
Figure 7C:
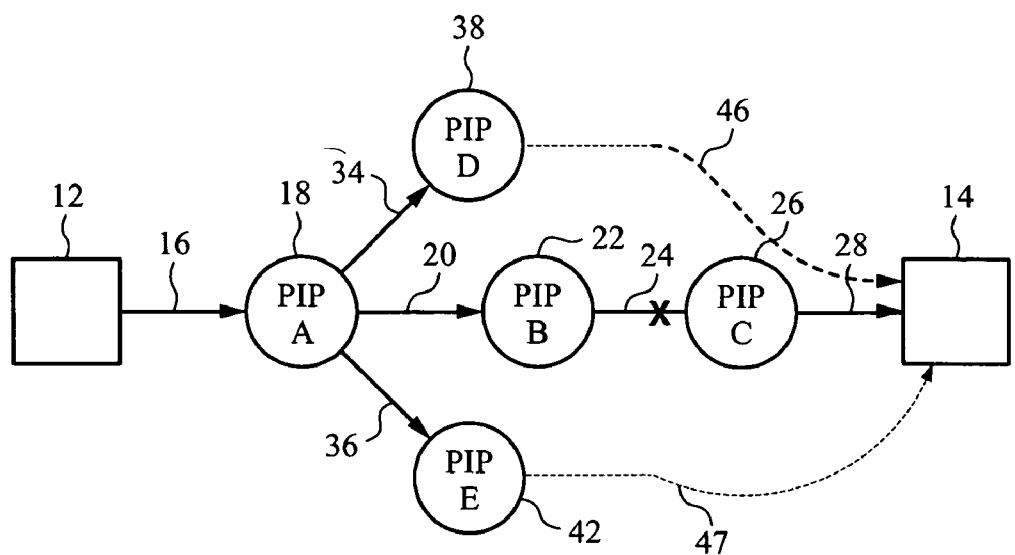

FIGS. 7A to 7E are a simplified example illustrating the processes shown in FIGS. 4A and 6. FIGS. 7A to 7C are similar to FIGS. 1A to 1C and the same labels are retained. In FIG. 7A the original line segment shows a fault shown by a "x" 25 between PIP B 22 and PIP C 26. For the purposes of brevity of explanation and so as not to obscure the invention, the connection 16 between the input 12 and PIP A 18 will be assumed to be fault free.

Figure 7D:
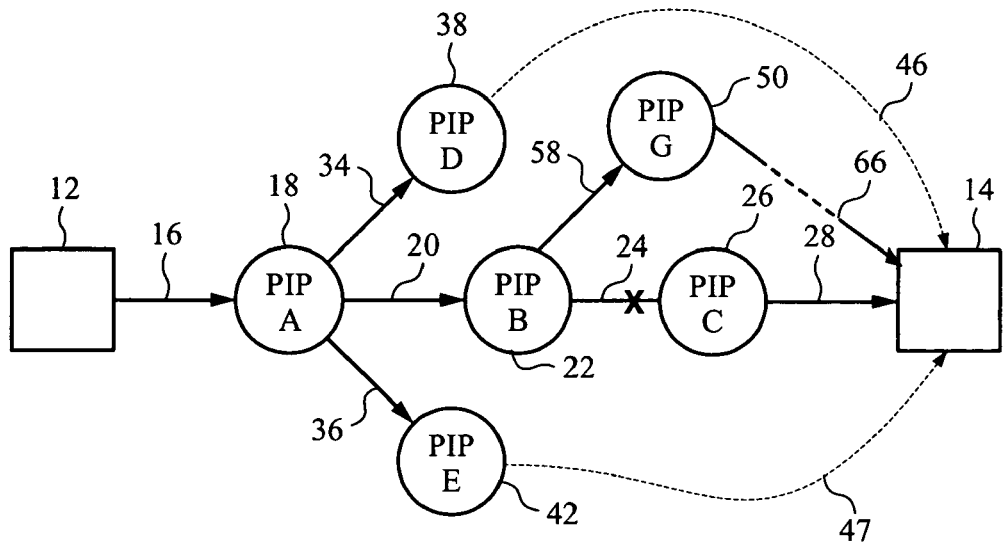
Figure 7E:
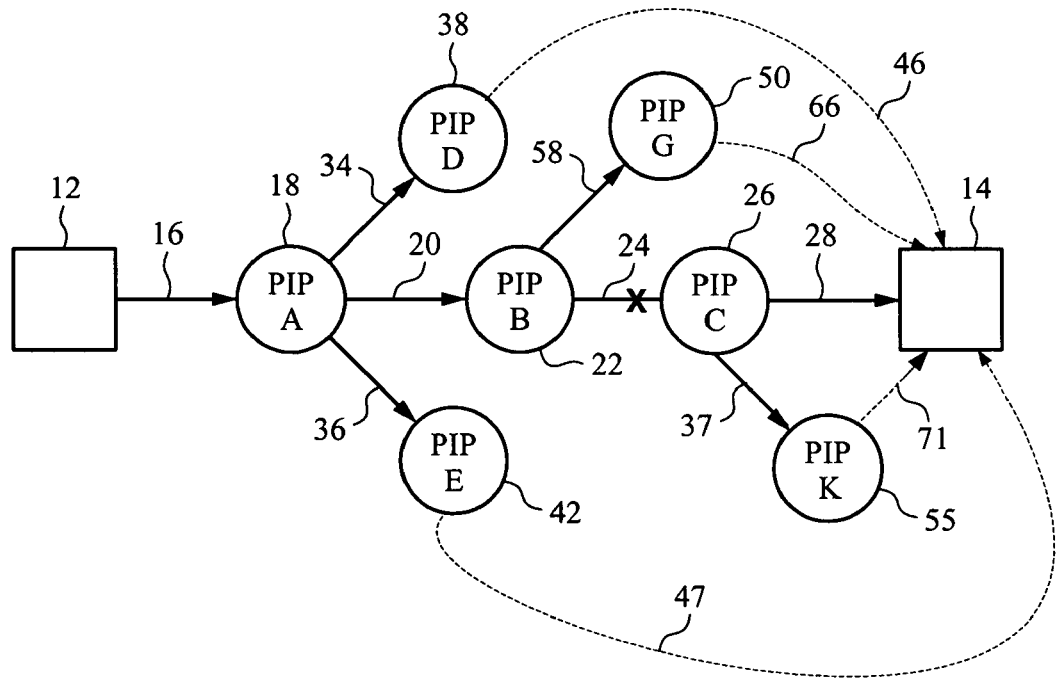

FIG. 7A is generated in relation to steps 402 to 408 of FIG. 4A by Module 120 reading PIP DB 112 in FIG. 6. Note at this point the fault location (x25) is not known. At step 404 the adjacent PIPs D, E, G, and K in FIGS. 7A–E are looked up in database 112. FIGS. 7B and C show the results of steps 410 to 416 for PIP D 38 having route 34 from PIP A 18 and auto route 46 to output 14 and for PIP E 42 having route 36 from PIP A 18 and auto route 47 to output 14. In one embodiment PIP B 22 is adjacent to PIP A 18 and PIP B has routes 24 and 28 to output 14. FIG. 7D shows the results of steps 410 to 416 for PIP G 50 having route 58 from PIP B 22 and auto route 66 to output 14. In one embodiment PIP C is also adjacent to PIP B and PIP C has route 28 to output 14. FIG. 7E shows the results of steps 410 to 416 for PIP K 55 having route 37 from PIP C 26 and auto route 71 to output 14. As can be seen from FIG. 7E all routes are generated regardless of where the fault may or may not be. Test vectors, as known to one of ordinary skill in the art, are generated for each route (not shown).

FIGS. 7A–7E correspond to steps 402–416 in FIG. 4A and illustrates the identification of adjacent PIPs and routes in the forward direction (from input 12 to output 14). Steps 452–466 in FIG. 4B correspond to FIG. 8 and illustrates the identification of adjacent PIPs and routes in the reverse direction (from output 14 to input 12).

Figure 8:
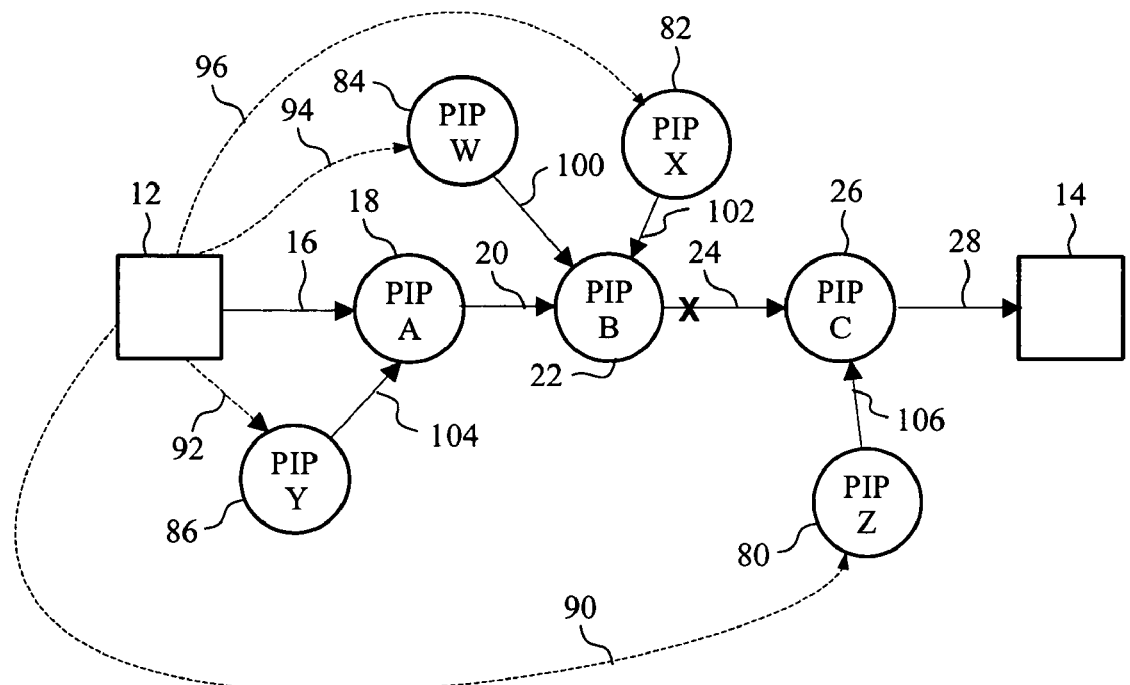
FIG. 8 is a simplified example illustrating the processes shown in FIGS. 4B and 6.

FIG. 8 is a simplified example illustrating the processes shown in FIGS. 4B and 6. Since the process in the reverse direction is similar to the process in the forward direction only the final graph is shown. FIG. 8 has similarities to FIG. 7E, except in the opposite direction.

At step 452 in FIG. 4B the adjacent PIPs W 84, X 82, Y 86, and z 80 for PIPs A 18, B 22, C 26 are looked up in database 112. At step 458 a route 28 from output 14 to PIP C 26 is added. Next for steps 460 to 466, the route 106 from PIP Z to PIP C and the autoroute 90 from the input 12 to PIP Z are added. In one embodiment PIP B 22 is also considered adjacent to PIP C 26 and PIP B has routes 16 and 20 from input 12. Again, at steps 476 and 458 PIP B 22 and route 24 are added. Next for steps 460 to 466, the routes 100 and 102 from PIPs W and X to PIP B, respectively, along with their associated autoroutes 94 and 96 from the input 12 to PIPs W and X, respectively, are added. In one embodiment PIP A is also adjacent to PIP B and PIP A has route 16 to input 12. Again, at steps 476 and 458, PIP A 18 and route 20 are added. Next for steps 460 to 466, the route 104 from PIP Y to PIP A, along with the associated autoroute 92 from the input 12 to PIP Y are added.

As can be seen from FIG. 8 all routes are generated regardless of where the fault may or may not be. Test vectors, as known to one of ordinary skill in the art, are generated for each route (not shown).

Module 120 generates a testing file having the forward and reverse routes as shown in FIGS. 7E and 8 and associated test vectors to test each route. The testing file is sent to tester 116 (see FIG. 6). Steps 429 to 434 of FIG. 4A (and/or steps 479 to 484 of FIG. 4B) are then performed by tester 116 on IC 117 as is well known to one of ordinary skill in the arts. On example of test results 124, including Tables 1 and 2 below, may be produced as follows:

TABLE 1

Forward Path

| Route | Pass/Fail |
| --- | --- |
| A–D | P |
| A–B | F |
| A–E | P |
| B–G | P |
| B–C | F |
| C–K | F |

TABLE 2

Reverse Path

| Route | Pass/Fail |
| --- | --- |
| Y–A | F |
| X–B | F |
| W–B | F |

TABLE 2-continued

| Reverse Path | |
|---|---|
| Route | Pass/Fail |
| A–B | F |
| B–C | F |
| Z–C | P |

From Table 1 above in one embodiment the route including PIPS A to B fails because in this case PIP C was used to autoroute. In another case it would pass because PIP G was used to auto-route. In an alternative embodiment auto-route can be prohibited from using PIPs on the original path.

Tables 1 and 2 are an example of the test results 124 in FIG. 6 that are stored in the tester 116 and sent back to computer 110 to be evaluated by failure analysis module 122. Failure analysis module 122 may be any one of many failure analysis programs known to one of ordinary skill in the arts. From table 1 above the fault can be isolated to routes from PIP B to output 14. From table 2, the result that route Z-C passes means that routes 106 and 28 are without failure. Hence using tables 1 and 2 the fault can be isolated to route 24 between PIP B and PIP C. In one embodiment the failure analysis is done manually and in other embodiments a computer program running on computer 110 is used.

While in one embodiment, as illustrated by the examples given in FIGS. 7A–E and 8, all routes are generated first before testing by tester 116 on IC 117 is done, in another embodiment a feedback path 130 (dotted line in FIG. 6) is used to assist in pruning or adjusting the routes to be tested. In this embodiment the failure analysis program module 122 receives either a sub-set of the test results or each test result as it is produced by tester 116 and thus dynamically modifies what sub-set or individual test vector(s) or path(s) are used to test IC 117 next.

FIGS. 5 and 6 thus describe a system for fault isolation on a line segment belonging to an integrated circuit (IC) having at least one programmable interconnection. The system includes: a database (e.g., PIP DB 112) having at least one programmable interconnection in the IC; and a processor (part of computer 110) coupled to the database and to a memory (e.g., memory 114) having a test path generation software module (e.g., module 120), where the test path generation software module includes: code for identifying original programmable interconnections on the line segment having a fault; code for identifying programmable interconnections adjacent to each of the original programmable interconnect points; and code for generating routes between an input of the line segment and an output of the line segment through each of the original programmable interconnect points and through each of the programmable interconnect points adjacent to each of the original programmable interconnect points. The system further includes: a tester (e.g., tester 116) coupled to the processor and the IC having the line segment, where the tester tests the line segment using the generated routes and test vectors. The system may additionally include: a test input file comprising the generated routes and test vectors for the generated routes, where the file is sent to the tester by the processor; a test results file having the test results on the line segment from the tester; and a failure analysis module (e.g., module 122) stored in the memory for evaluating contents of the test results file.

In the foregoing specification, the invention has been described with reference to specific exemplary embodiments thereof. Other embodiments will be apparent to those of ordinary skill in the art. For example, line segments have been described in reference to FPGAs and CPLDs, but other types of PLD are used in alternative embodiments. Thus, it is evident that various modifications and changes may be made thereunto without departing from the broader spirit and scope of the invention as set forth in the appended claims and their full scope of equivalents.

The invention claimed is:

1. A method of locating a fault on a failed line segment of a switch matrix comprising:
generating a first route between an input of the switch matrix and an output of the switch matrix through a first programmable interconnect point on the line segment and through a first adjacent programmable interconnect point;
configuring the first route in the switch matrix;
applying a first test vector at the input;
measuring first test data at the output;
generating a second route between the input and the output through the first programmable interconnect point on the line segment and through a second adjacent programmable interconnect point;
configuring the second route in the switch matrix;
applying a second test vector at the input;
measuring second test data at the output; and
comparing the first test data and the second test data against a layout schematic of a programmable logic device so as to locate the fault on the failed line segment.

2. The method of claim 1 wherein a path from the adjacent programmable interconnect point to one of the input and the output is generated by an auto-route tool.

3. The method of claim 2 wherein the path excludes the line segment.

4. The method of claim 1 wherein the first adjacent programmable interconnect point is on the line segment.

5. The method of claim 1 wherein the switch matrix is incorporated in a programmable logic device.

6. The method of claim 1 wherein the second test vector is the same as the first test vector.

7. The method of claim 1 wherein the step of generating the second route is performed prior to the step of applying the first test vector.

8. The method of claim 7 wherein the first route and the second route are stored in a route directory.

9. A method of isolating a fault on a line segment of a switch matrix comprising:
generating a first route between an input of the switch matrix and an output of the switch matrix through a first programmable interconnect point on the line segment and through a first adjacent programmable interconnect point; configuring the first route in the switch matrix; applying a first test vector at the input, the first test vector comprising a first series of first digital test values followed by a second series of second digital test values followed by a third series of the first digital test values; measuring first test data at the output; storing the first test data and at least a portion of the first route; generating a second route between the input and the output through the first programmable interconnect point on the line segment and through a second adjacent programmable interconnect point; configuring the second route in the switch matrix; applying a second test vector at the input; measuring second test data at the output; storing the second test data and at least a portion of the second route; and comparing the first test data and the second test data against a layout schematic of a programmable logic device so as to locate the fault on the failed line segment.

10. The method of claim 9 wherein there are at least three first digital test values in the first series.

11. The method of claim 10 wherein there are at least three second digital test values in the second series.

12. The method of claim 1 wherein the line segment includes at least four programmable interconnect points.

13. A method of isolating a fault on a line segment of a switch matrix comprising:
 (a) identifying original programmable interconnect points ("PIPs") in the line segment;
 (b) looking up adjacent PIPs in a PIPs database, each of the adjacent PIPs being adjacent to at least one original PIP;
 (c) generating a first route through a first port of the switch matrix to an Nth original PIP where N is an integer;
 (d) adding a second route from the Nth original PIP to an Mth adjacent PIP where M is a second integer;
 (e) adding a third route from the adjacent PIP to a second port of the switch matrix;
 (f) storing a route including the first route, second route, and third route in a route directory;
 (g) repeating steps (d), (e) and (f) for all adjacent PIPs adjacent to the original PIP;
 (h) repeating steps (c), (d), (e), (f) and (g) for all original PIPs;
 (i) configuring the route in the switch matrix;
 (j) applying a test vector at an input of the route;
 (k) reading test data at an output of the route;
 (l) storing the test data;
 (m) repeating steps (i), (j), (k) and (l) for all routes in the route directory; and if a fault is detected,
 (n) correlating the fault with a particular location of the switch matrix.

14. A system of isolating a fault on a line segment of a switch matrix comprising:
 means for identifying original programmable interconnect points on the line segment;
 means for identifying programmable interconnect points adjacent to each of the original programmable interconnect points;
 means for generating routes between an input of the line segment and an output of the line segment through each of the original programmable interconnect points and through each of the programmable interconnect points adjacent to each of the original programmable interconnect points;
 means for testing the routes; and
 means for correlating the fault with a particular location on the line segment.

15. A system for fault isolation on a line segment in an integrated circuit (IC) having at least one programmable interconnection, the system comprising:
 a database having the at least one programmable interconnection in the IC;
 a processor coupled to the database and to a memory having a test path generation software module, the test path generation software module comprising:
  code for identifying original programmable interconnections on the line segment having a fault;
  code for identifying programmable interconnections adjacent to the original programmable interconnect points;
  code for generating routes between an input of the line segment and an output of the line segment through the original programmable interconnections and through the programmable interconnections adjacent to the original programmable interconnections; and
 a tester coupled to the processor and the IC having the line segment, the tester for testing the line segment using the generated routes; and
 a failure analysis software module stored in the memory and configured to receive test results related to the line segment from the tester and to perform fault isolation analysis on the received test results to correlate a fault on the line segment with a particular location of the IC.

16. The system of claim 15 further comprising:
 a test input file comprising the generated routes and test vectors for the generated routes, the file sent to the tester by the processor;
 a test results file comprising the test results on the line segment from the tester.

17. The system of claim 16 wherein information used by the tester from the test input file is modified based on feedback from the failure analysis software module.

18. The system of claim 15 wherein the database further comprises the original programmable interconnections and the programmable interconnections adjacent to the original programmable interconnections.

19. The system of claim 15 wherein the IC comprises a programmable logic device (PLD).

20. The system of claim 19 wherein the database further comprises all the original programmable interconnections on the PLD.

21. A method for fault isolation on a line segment in an integrated circuit (IC) having at least one programmable interconnection, the method comprising:
 identifying an original programmable interconnection point on the line segment having a fault;
 identifying an output programmable interconnection point adjacent to the original programmable interconnection point;
 generating a route between an input of the line segment and an output of the line segment through the original programmable interconnection point and through the output programmable interconnection point; and
 correlating the fault with a particular location on the integrated circuit (IC).

22. The method of claim 21 further comprising:
 identifying an input programmable interconnection point adjacent to the original programmable interconnection point; and
 generating another route between an input of the line segment and an output of the line segment through the original programmable interconnection point and through the input programmable interconnection point.

23. The method of claim 22 further comprising:
 testing the generated route on the line segment in the integrated circuit (IC) to produce a test result on whether a generated route passes or fails a test,
 wherein the step of correlating the fault includes comparing the test result against a layout schematic of the integrated circuit (IC) to determine a location of the fault on the line segment.

* * * * *